United States Patent [19]

Bergendahl et al.

[11] 4,394,437
[45] Jul. 19, 1983

[54] PROCESS FOR INCREASING RESOLUTION OF PHOTOLITHOGRAPHIC IMAGES

[75] Inventors: Albert S. Bergendahl, Underhill; Mark C. Hakey, Milton; John P. Wilson, Hinesburg, all of Vt.

[73] Assignee: International Business Machines Corporation, Armonk, N.Y.

[21] Appl. No.: 305,056

[22] Filed: Sep. 24, 1981

[51] Int. Cl.³ .............................................. G03C 5/00
[52] U.S. Cl. .................................. 430/312; 430/313; 430/316; 430/329; 430/394; 430/502
[58] Field of Search ............... 430/313, 312, 316, 329, 430/394, 502

[56] References Cited

U.S. PATENT DOCUMENTS

| | | | |
|---|---|---|---|
| 3,317,320 | 5/1967 | Reber | 96/36.2 |
| 3,506,441 | 4/1970 | Gottfried | 430/312 |
| 3,518,084 | 6/1970 | Barson et al. | 96/36.2 |
| 3,615,464 | 10/1971 | Agosta et al. | 430/312 |
| 3,615,466 | 10/1971 | Sahni | 430/312 |
| 3,647,445 | 3/1972 | Burns | 96/35 |
| 3,823,015 | 7/1974 | Fassett | 96/36 |
| 3,955,981 | 5/1976 | Stachniak | 430/312 |

FOREIGN PATENT DOCUMENTS 1334377 10/1973 United Kingdom .

OTHER PUBLICATIONS

IBM Technical Disclosure Bulletin, vol. 21, #5, 10/78, p. 2133, B. J. Lin, "Portable Intimately Contacted Mask".
IBM Technical Disclosure Bulletin, vol. 13, #10, 03/71, p. 3080, J. J. Lajza, Jr., "Eliminating Clear Type Mask Defects in . . .".
IBM Research Report #RC 7578, Mar. 26, 1979, B. J. Lin, "Optical Methods for Fine-Line Lithography".

*Primary Examiner*—Jack P. Brammer
*Attorney, Agent, or Firm*—Francis J. Thornton

[57] ABSTRACT

The present invention describes conformable masking techniques which can be successfully made and used in a practical manufacturing environment while providing increased resolution of photolithographic images while eliminating all manner of defects that might presently be encountered in the masks currently used in the semiconductor industry.

In the present invention a body is first coated with a positive photoresist overcoated with a conformable mask which is exposed through a fixed mask and developed to define a replica of the fixed mask, together with all its defects. The underlying photoresist is then exposed to light through developed openings in the conformable mask. The conformable mask is then stripped and a new conformable mask laid down. This new conformable mask is now exposed through a second fixed mask having the same image as the first fixed mask, but presumably with different defects and developed to define a replica of the second mask. The underlying photoresist is again exposed through the second conformable mask and developed. As a result of using two independently defined conformable masks clear image defects in the fixed masks are prevented from being reproduced in the underlying photoresist and are not doubly exposed. Only desired regions in the underlying photoresist are doubly exposed.

9 Claims, 20 Drawing Figures

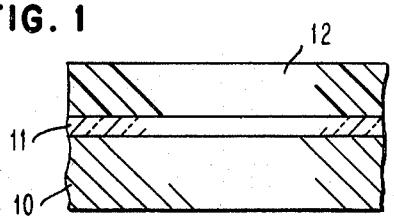
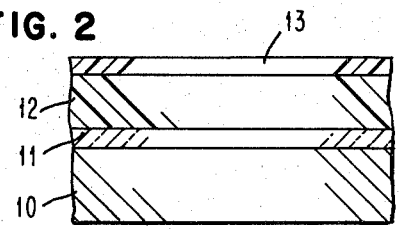
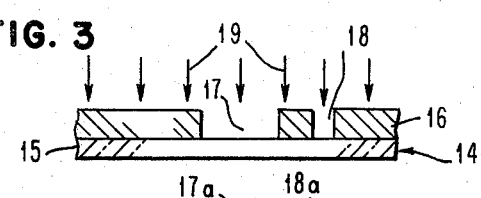
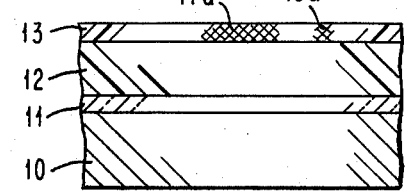
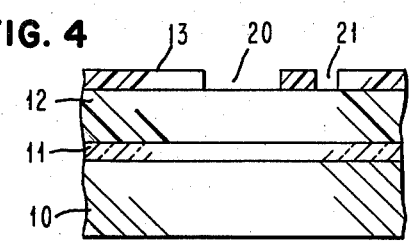
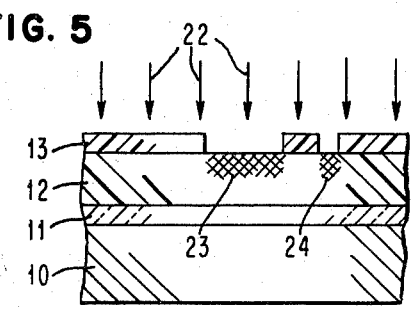
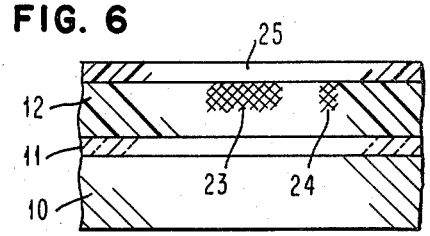
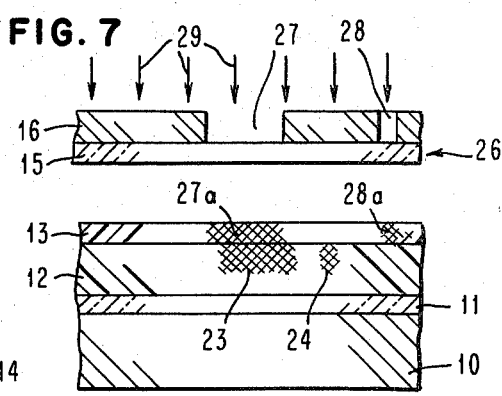
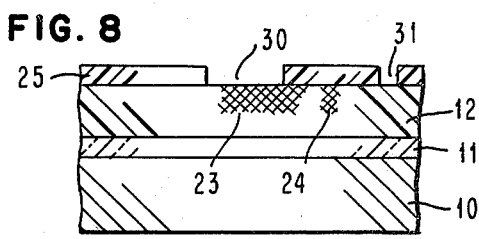
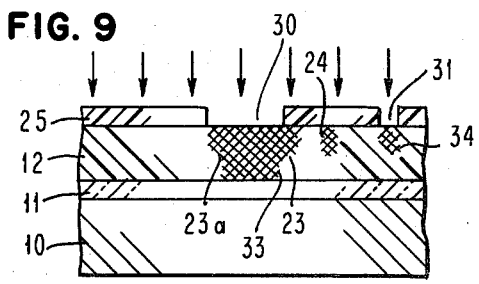
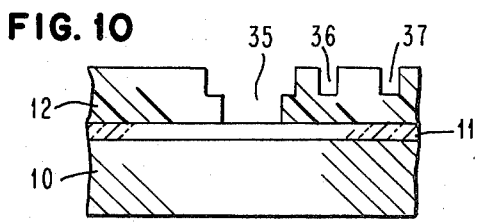

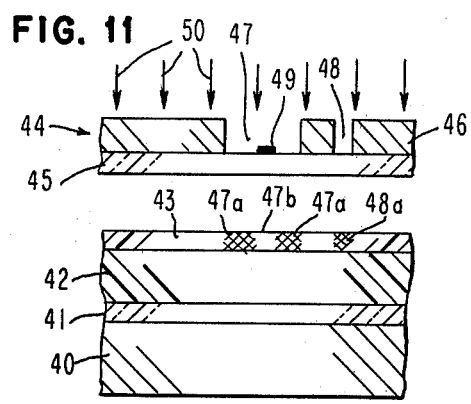
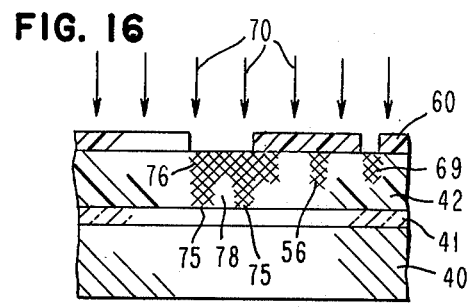
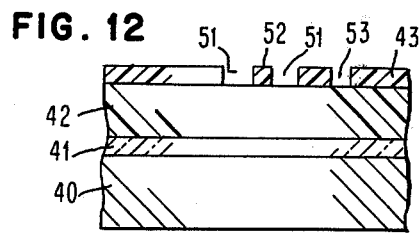
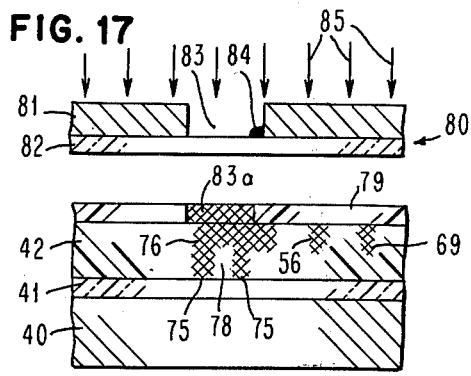
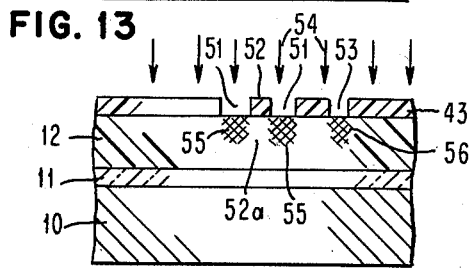
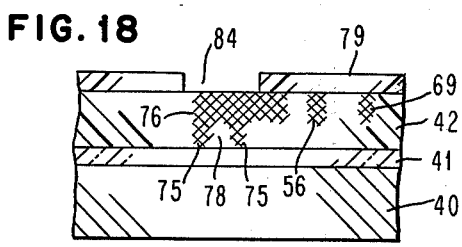
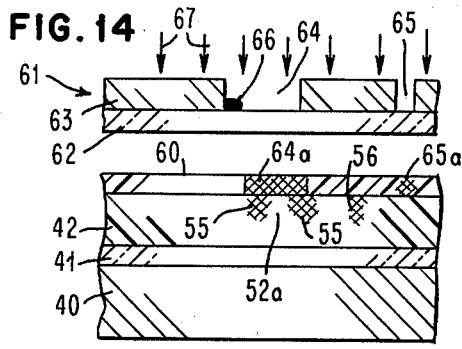
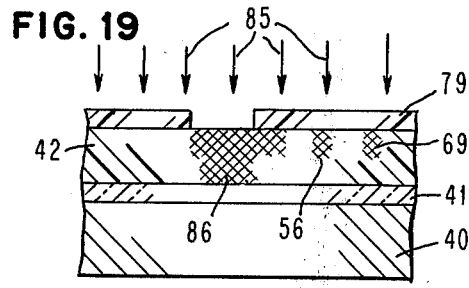
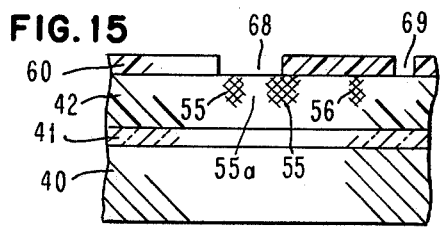
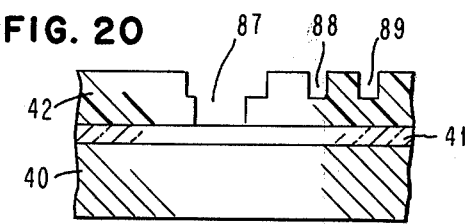

PROCESS FOR INCREASING RESOLUTION OF PHOTOLITHOGRAPHIC IMAGES

FIELD OF THE INVENTION

This invention relates generally to photolithographic process and more particularly relates to lithographic processes used in the manufacture of semiconductor devices.

BACKGROUND ART

Conformable masking techniques were long ago proposed for use in the semiconductor industry. In this technique a layer of photoresist material was to be used to define selected openings to the surface of the semiconductor body and a second conformable layer of photoresist material was to be deposited upon the first photoresist material and utilized as a mask for the photoresist in which the final desired holes are to be defined. This technique has not however, met with success because it is inherently susceptible to both positive and negative mask defects and other damage due to foreign particles and thus has failed to achieve the desired results.

SUMMARY OF THE INVENTION

The present invention now provides a means whereby such conformable masking techniques can be successfully made and used in a practical manufacturing environment while providing increased resolution of photolithographic images while eliminating all manner of defects that might presently be encountered in the masks currently used in the semiconductor industry.

In accordance with the method of the present invention a body to be treated is first coated with a positive photoresist which is overcoated with a conformable mask which is comprised of a second photoresist sensitive to a different wavelength of light and which requires a different solvent and developer than the underlying photoresist. This second layer of photoresist is exposed through a fixed mask and developed to define a replica of the fixed mask, together with all its defects, in the conformable layer. Thus the second layer serves as a conformable mask for the first, underlying, photoresist. This underlying photoresist is then exposed to light through developed openings in the conformable mask. The conformable mask is then stripped and a new photoresist conformable mask layer laid down. This new conformable mask is now exposed through a second fixed mask having the same image as the first fixed mask, but presumably with different defects and developed to define a replica of the second mask. The underlying photoresist is again exposed through the second conformable mask and developed. As a result of using two independently defined conformable masks defects in the fixed masks are prevented from being reproduced in the underlying photoresist and are not doubly exposed. Only those regions in the underlying photoresist which are to be removed are doubly exposed such that as they are developed away the underlying layer of the semiconductor surface is exposed.

This process can be expanded and altered as necessary. If a third conformable coating is utilized after the second comformable coating and the amount of blanket exposure reduced both opaque and clear image defects will be eliminated.

These features of the invention are best understood by reference to the following detailed description when read in conjunction with the accompanying drawing wherein:

DESCRIPTION OF THE DRAWINGS

FIGS. 1 through 11 depict a preferred method of the invention for utilizing conformable coatings to eliminate mask defects.

FIGS. 11-20 depict the steps of an alternate method of the invention.

PREFERRED EMBODIMENT OF THE INVENTION

Referring now to the drawings and more particularly to FIGS. 1 to 10, there is shown in FIG. 1 a body 10 having an oxide layer 11 on the surface thereof overcoated with a coating of photoresist 12. The photoresist used for layer 12 ideally is sensitive to only certain selected wavelengths of light and was a selected solvent base and a selected developer. The photoresist sold by DuPont under the tradename PMMA* is an example of a suitable photoresist. This photoresist is sensitive only to deep ultraviolet wavelengths in the order of 254 nanometers. Moreover because such photoresist is put onto the surface in liquid form it tends to form a very planar surface regardless of the configuration of the underlying oxide layer.

A conformable mask in the form of thinner deposit 13 of a different photoresist, which has a different solvent base and requires a different developer from that of the first photoresist coating 12 and that will absorb deep ultraviolet light in the order of 254 nanometers, but is sensitive only to ultraviolet light in the order of 300 nanometers is now applied over the surface of the first underlying coating 12 as shown in FIG. 2. The photoresist sold under the tradename AZ2400* by the Shipley Manufacturing Company is a photoresist that is available and is suitable for this thinner deposit 13.

Once the photoresist 13 is deposited, a standard optical photomask 14 containing a specified image is positioned over the coated semiconductor body 10 as shown in FIG. 3. The photomask 14 is typically a plate of glass 15 coated with an opaque layer 16. This opaque layer 16 can be either a layer of metal as shown or a developed photographic emulsion. In either event the layer 16 is formed into a pattern using known photolithographic techniques.

Because of dust, dirt, pinholes and the like in the material comprising the layer 16, defects can occur in photoresist exposed through the mask 14. As shown in FIG. 3, a desired clear opening 17 exists in the center of the mask 14 and immediately adjacent thereto is an undesired clear defect area in the form of an unwanted opening 18. Utilization of the present invention effectively eliminates this defect area 18 from being reproduced in the full thickness of the coating 12.

Once the mask 14 is properly aligned with the underlying body 10 the photoresist 13 forming the conformable mask is exposed in the conventional manner by passing light indicated by arrows 19 through the mask 14. Because of the opaqueness of the layer 16 only those regions 17a and 18a in the layer 13 immediately below the respective openings 17 and 18 are exposed in the photoresist layer 13. By selecting the wavelength of light to be in the order of 300 nanometers, only the layer 13 becomes exposed.

After exposure of layer 13 the mask 14 is removed and the layer 13 developed. The layer 13 is now formed as a duplicate of the mask 14 and becomes what is known as a conformable mask. Developers for the layer 13 are well knonw, say for example comprise a 0.195N solution of potassium hydroxide or may be the so-called AZ developer sold by the Shipley Manufacturing Company. As shown in FIG. 4 openings 20 and 21 are formed in the layer 13. These correspond respectively to the openings 17 and 18.

Once the layer 13 has been developed the entire as shown in FIG. 5 is blanket exposed to a suitable light source such as a mercury lamp, which provides both 254 and 300 nanometer light indicated by arrows 22. The light will expose the layer 13 while simultaneously passing through the openings 20 and 21 to expose the regions 23 and 24 in the underlying layer 12. Because the 254 nanometer light is absorbed in the layer 13 the remainder of the layer 12 remains unexposed. The absorption of this light in the layer 13 causes partial decomposition of the photoactive compound and aids in the removal of the exposed layer 13.

As is well known in the photographic industry the depth of exposure of the region 23 and 24 in the photoresist layer 12 is a time-intensity effect. Thus, the intensity of the light and the duration it remains on the photoresist layer determines the depth of the exposed regions 23 and 24 in the layer 12. As shown in FIG. 5, the depths of the exposed regions 23 and 24 are controlled to extend slightly more than halfway through layer 12. These regions 23 and 24 have been exposed through the layer 13, i.e. the conformable mask, is removed (not shown).

Immediately thereafter a new layer 25 of conformable masking material is laid over partially exposed photoresist material 12 as shown in FIG. 6. Again this conformable mask 25 is preferably composed of a layer of photoresist which is identical to that of layer 13, that is it has a different solvent base then the layer 12 and will absorb a deep ultraviolet while being sensitive only to the mid ultraviolet wavelengths.

Once the conformable coating 25 is deposited over the layer 12 a mask 26 is positioned over the device as shown in FIG. 7. This second mask 26 is made to be a duplicate of the specified image that was also provided in mask 14. Thus, this mask 26 is also provided with an intended clear area 27. In this case however, it is probable that any clear defect area 28 would be located in a different position with respect to the intended clear area 27.

For purposes of illustration only the second mask 26 is shown as having the clear area 27 slightly misaligned with respect to the previously partially exposed region 23 in the photoresist layer 12. Again, as shown in FIG. 7, the unit is now exposed to a suitable light beam 29 which exposes the photoresist layer 25 in the regions 27a and 28a which respectively underlie the clear area 27 and the defect region 28. The mask 26 is removed and the layer 25 is developed leaving openings 30 and 31 therein as shown in FIG. 8. The unit is now subjected to a sufficiently long blanket exposure of light indicated by arrows 32 in FIG. 9. This light contains both mid and deep ultraviolet lights sufficient to not only expose the coating 12 beneath openings 30 and 31, but also help to decompose the layer 25 as discussed above with respect to FIG. 5. This exposure causes the region 23 to be slightly expanded by the area 23a while simultaneously causing the region 33 underlying the area 23 to become exposed. Simultaneously a region 34 becomes exposed by virtue of the defect area 31 in the conformable coating 25. Region 33 becomes exposed down to the surface of the oxide layer 11 because of the time intensity effect of photographic exposure as discussed above.

Following the exposure of coating 12 the mask 25 is removed and the photoresist layer 12 developed. As shown in FIG. 10 an opening 35 is now provided in coating 12 which extends to the surface of the oxide coating 11 on the semiconductor body 10. The oxide coating can now be treated as is well known in the art.

It should be noted that both the exposed regions 24 and 34 have also been removed leaving openings 36 and 37 in the surface of the photoresist layer 12. However, because of the utilization of two different masks 14 and 26, neither region 24 or 34 received sufficient light to be exposed all the way to the surface of the oxide and thus the openings 36 and 37 do not extend fully through the layer 12.

In summary; this invention provides the improved image resolution capability of the conformable mask technique while simultaneously eliminating defects uncovered in the conformable mask technique. The invention also eliminates the partial etching of oxide defect areas as is known to occur in the prior art. The method described above is of course useful for both positive and negative photoresist.

The above described can also be adapted to eliminate positive defects on the surface of the device by using a third conformable coating as is shown in FIGS. 11 through 20.

FIG. 11 depicts a semiconductor body 40 coated with an insulating oxide layer 41 which is in turn overcoated with a photoresist layer 42 and a conformable mask layer 43. Disposed over the unit is a mask 44 which is composed of a glass layer 45 and a metallic deposition 46 thereon. As shown the mask 44 is provided with a desired opening 47 which is the configuration to be created in the conformable mask layer 43. Also shown, in the mask 44, is a defect opening 48 and an opaque particle 49, such as dust, dirt, or the like, in the desired opening 47. The conformable mask 43 is now exposed through the rigid mask 44 by beaming suitable light, indicated by the arrows 50 through the mask 44. This light again must be of a suitable wavelength such that it will expose the relatively thin layer 43 which forms the conformable mask without causing any reaction in the lower photoresist material 42. In this instance because of the clear defect opening 48 in mask 44 the conformable mask 43 is exposed in area 48a as well as being exposed in the area 47a beneath the opening 47. In this case a dirt particle 49, sufficiently opaque as to block the light, is located in the desired opening 47 and causes a region 47b to remain unexposed immediately below the dust particle 49. After exposure the mask 44 is removed and the conformable mask 43 is developed as discussed previously.

As shown in FIG. 12 this results in the conformable mask 43 being left with an opening 51 which has in the center thereof a protrusion 52 of unexposed material where the conformable mask material was not developed because of the opaque defect 49 as shown in FIG. 11. There is also created an undesirable opening 53 which underlies the defect area 48a. The unit is then blanket exposed to suitable light rays 54 (FIG. 13) to cause exposure of the underlying photoresist layer 42. The light rays pass the openings 51 and 53 resulting in exposure of the underlying photoresist material 42. The exposed areas of the underlying photoresist material 42 is shown as the areas 55 and 56 under the openings 51 and 53. As shown in FIG. 13, a region 52a immediately below the protrusion 52 remains unexposed.

Turning now to FIG. 14, the body 40 carrying the partially exposed layer 42 is now coated with a new conformable mask 60. Over the conformable mask 60 a new fixed mask 61 is exposed. Again this mask 61 is formed of glass 62 and metal 63 and provided with an opening 64. As shown the mask 61 is slightly misaligned with the previously created exposed area 55 disposed within the photoresist layer 42. However, such misalignment will not adversely affect the creation of the final desired result. As indicated the mask 61 also has a clear defect area 65 and another particle 66 disposed within the desired opening 64. Again the unit is exposed to ultraviolet light 67 creating exposed areas 64a and 65a in the underlying conformable mask material 60. The region of mask 60 underlying opaque defect 66 remains unexposed. As shown in FIG. 15, the conformable mask 60 is developed so that openings 68 and 69 are provided in the conformable mask 60. The opening 68 corresponds to the opening 64 while the opening 67 corresponds to the opaque defect area 65. Again the unit is exposed to suitable blanket radiation 70. This exposes a substantial region 71 of the layer 42 and because of the time-intensity affect of the light beam 70 the regions 55 are effectively driven deeper into the layer 42 and are indicated by the extension 75. There still remains a small unexposed portion 78 of layer 42 which effectively corresponds to the unexposed area 52a under the opaque defect 49. Following this exposure step the conformable mask 60 is stripped from the surface of the layer 42. To expose portion 78 it is necessary to deposit and expose a third conformable mask layer 79 as shown in FIG. 17. This mask 79 is comprised of the same material that masks 43 and 60 were comprised. A fixed mask 80 formed of glass 81 and an opaque coating 82 having a desired image opening 83 is positioned over the conformable mask 79. Again this fixed mask is provided with the same desired images as the other fixed masks 44 and 61. In this case in the desired image area 83 there appears an opaque defect 84 which blocks some of the light 85. Thus, a region 83a narrower than the desired image region 83 is exposed in the conformable mask 79. Subsequently the conformable mask layer 79 is developed to form, as shown in FIG. 18, an opening 84 therein which corresponds to the image area 83. This is now blanket exposed with light 85 (FIG. 19) causing the previously unexposed region 78 in photoresist 42 to now become exposed. This is shown as fully exposed region 86. The conformable mask 79 is removed and the photoresist material 42 developed leaving the desired image area 87, in photoresist material 42, extending to the surface of the oxide layer 41. Thus, the desired image of the fixed masks has been transferred into the photoresist layer 42. The underlying exposed oxide layer 41 can now be treated as is well known to the art.

It should be noted that the formed regions 56 and 69 are also developed away leaving openings 88 and 89. However, these openings 88 and 89 do not penetrate completely through the layer 42 as shown in FIG. 20. By using three conformable masks as taught in this embodiment both positive and negative, i.e. clear and opaque defects in the fixed masks utilized can be effectively eliminated in the resist layer 42. It should be noted that electron beams, ion beams, etc can be used to form the conformable masks as well as the final image in the first photoresist layer.

While the invention has been particularly described with reference to the preferred embodiments thereof it will be understood by those skilled in the art that the foregoing and other changes in form and details be made therein without departing from the spirit and scope of the invention.

What is claimed is:

1. A method of developing relief images in a first layer of photoresist comprising the steps of:
    applying a first layer of photoresist, sensitive to a selected wavelength of light, a selected solvent and a selected developer, to the surface of a substrate;
    applying a second layer of photoresist over said first layer; said second layer of photoresist being sensitive to a wavelength of light, a solvent and a developer different from said selected wavelength, solvent and developer to which said first layer of photoresist is sensitive,
    forming a first relief image in said second layer of photoresist by exposure through a fixed mask having an image thereon,
    partially exposing said first layer of photoresist using said second layer as a mask,
    removing said second layer of photoresist,
    applying a third layer of photoresist over said first layer, said third layer of photoresist being sensitive to a wavelength of light, a solvent and a developer different from said selected wavelength, solvent and developer to which said first layer of photoresist is sensitive,
    forming a second relief image in said third layer substantially identical to the first relief image formed in said second layer by exposure through a second mask having the same image as the said first mask but having different defects thereon,
    re-exposing said first layer of photoresist using said third layer as a mask to fully expose only those partially exposed portions of said first layer thereof corresponding to areas being exposed by said third layer; and
    developing a relief image in said first layer of photoresist, said relief image having openings extending to the surface of said substrate only in said fully exposed areas.

2. The method of claim 1 wherein;
    said first relief image has selected openings extending through said second layer of photoresist;
    said second relief image has selected openings extending through said third layer photoresist, and
    said second exposure of said first layer of photoresist using said third layer as a mask fully exposes only those partially exposed portions thereof corresponding to openings in said third mask.

3. The method of claim 2 wherein there is further provided the step of:
    removing said third layer of photoresist prior to the developing of said relief image in said first layer.

4. A method of developing relief images in a first layer of photoresist comprising the steps of:
    applying a first layer of photoresist sensitive to a selected wavelength of light, a selected solvent and a selected developer to a substrate,
    applying a second layer of photoresist over said first layer; said second layer of photoresist being sensitive to a wavelength of light, solvent and developer different from that to which said first layer of photoresist is sensitive, forming a relief image in said second layer having openings extending through said second layer of photoresist by exposure through a first fixed mask having a predetermined pattern thereon, partially exposing said first layer of photoresist through said second layer;

removing said second layer of photoresist, applying a third layer of photoresist over said first layer said second layer of photoresist being sensitive to a wavelength of light, solvent and developer different from that to which said first layer of photoresist is sensitive;

forming a relief image in said third layer substantially identical to the first relief image formed in said second layer and having openings extending through said third layer of photoresist substantially overlying said partially exposed regions of said first layer of photoresist by exposure through a second fixed mask having the same pattern as said first fixed mask but having different defects thereon, re-exposing said first layer of photoresist to further expose only those partially exposed portions thereof corresponding to the openings in the second relief image;

removing said third layer of photoresist;

applying a fourth layer of photoresist over said first layer said fourth layer of photoresist being sensitive to a wavelength of light, solvent and developer different from that to which said first layer of photoresist is sensitive;

forming a third relief image in said fourth layer having openings extending through said fourth layer of photoresist through exposure to a third mask having the same pattern as said first and second fixed masks, but having different defects thereon, re-exposing said first layer of photoresist to further expose those exposed portions thereof corresponding to the openings in the third relief image;

removing the fourth layer of photoresist, developing a relief image having openings extending through said first layer of photoresist, said openings being defined by said multiply exposed areas.

5. The method of claim 3 wherein said second and third layers are substantially thinner than said first layer.

6. The method of claim 3 wherein said second relief image is substantially the same as said first relief image.

7. The method of claim 4 wherein said second, third and fourth layers are substantially thinner than said first layer.

8. The method of claim 5 wherein said first relief image is formed by exposing said second layer of photoresist through a first fixed mask and developing said second layer, and said second relief image is formed by exposing said third layer of photoresist through a second fixed mask and developing said third layer.

9. The method of claim 7 wherein said first relief image is formed by exposing said second layer of photoresist through a first fixed mask and developing said second layer, said second relief image is formed by exposing said third layer of photoresist through a second fixed mask and developing said third layer, and said third relief image is formed by exposing said fourth layer of photoresist through a third fixed mask and developing said fourth layer.

* * * * *